(12) United States Patent
Kadous et al.

(10) Patent No.: US 8,385,465 B2
(45) Date of Patent: Feb. 26, 2013

(54) TRANSMITTER CHAIN TIMING AND TRANSMIT POWER CONTROL

(75) Inventors: Tamer A. Kadous, San Diego, CA (US);
Brian M. George, San Diego, CA (US);
Jibing Wang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1109 days.

(21) Appl. No.: 12/268,198

(22) Filed: Nov. 10, 2008

(65) Prior Publication Data

US 2009/0245417 A1    Oct. 1, 2009

Related U.S. Application Data

(60) Provisional application No. 61/040,656, filed on Mar. 29, 2008.

(51) Int. Cl.
*H04L 25/49* (2006.01)
(52) U.S. Cl. .................. 375/297; 375/295; 375/345
(58) Field of Classification Search .................. 375/297, 375/295, 345; 455/126, 114.3; 330/129
See application file for complete search history.

(56) References Cited

U.S. PATENT DOCUMENTS

| | | | | |
|---|---|---|---|---|
| 5,852,630 | A * | 12/1998 | Langberg et al. | 375/219 |
| 6,721,368 | B1 * | 4/2004 | Younis et al. | 375/295 |
| 7,684,514 | B2 * | 3/2010 | Saito et al. | 375/297 |
| 8,073,085 | B1 * | 12/2011 | Vaidyanathan et al. | 375/345 |
| 2003/0058952 | A1 * | 3/2003 | Webster et al. | 375/260 |
| 2005/0119025 | A1 * | 6/2005 | Mohindra et al. | 455/552.1 |
| 2005/0180533 | A1 * | 8/2005 | Hamman | 375/348 |
| 2005/0287965 | A1 * | 12/2005 | Gu | 455/127.1 |
| 2007/0200624 | A1 * | 8/2007 | Chen et al. | 330/129 |
| 2007/0211811 | A1 * | 9/2007 | Subramaniam et al. | 375/260 |
| 2007/0222519 | A1 * | 9/2007 | Deng et al. | 330/285 |
| 2008/0139141 | A1 * | 6/2008 | Varghese et al. | 455/114.3 |
| 2008/0181340 | A1 * | 7/2008 | Maxim | 375/346 |
| 2009/0075689 | A1 * | 3/2009 | Aniruddhan et al. | 455/550.1 |
| 2009/0221235 | A1 * | 9/2009 | Ciccarelli et al. | 455/62 |
| 2009/0238313 | A1 * | 9/2009 | Wang et al. | 375/345 |
| 2010/0091702 | A1 * | 4/2010 | Luo et al. | 370/328 |
| 2010/0197365 | A1 * | 8/2010 | Ripley et al. | 455/572 |
| 2012/0147795 | A1 * | 6/2012 | Narayan et al. | 370/281 |

FOREIGN PATENT DOCUMENTS

EP    1830465    9/2007

OTHER PUBLICATIONS

International Search Report & Written Opinion—PCT/US2009/036252, International Search Authority—European Patent Office—Jul. 6, 2009.

* cited by examiner

*Primary Examiner* — Shuwang Liu
*Assistant Examiner* — Helene Tayong
(74) *Attorney, Agent, or Firm* — Larry J. Moskowitz; Abdollah Katbab

(57) ABSTRACT

In a communications system, transmitter power gain can be changed between symbols. A power gain change of a first part of a transmit chain is initiated a first time, whereas a power gain change of a second part of the transmit chain is initiated at a second time, such that the resulting power gain changes of the first and second parts both occur substantially within an inter-symbol time in a desired relationship to one another. In one example, the power gain change of the first part is initiated before the beginning of the inter-symbol time to account for expected serial bus latency between initiation and execution of the power gain change of the first part. The power gain change of the second part is initiated during the inter-symbol time such that overall power does not exceed an amount (for example, a maximum permitted under a communication standard).

29 Claims, 6 Drawing Sheets

OVERLAPPING GUARD PORTIONS

OVERLAPPING GUARD PORTIONS

POTENTIAL OUTPUT POWER PROBLEM

US 8,385,465 B2

TRANSMITTER CHAIN TIMING AND TRANSMIT POWER CONTROL

CROSS-REFERENCE TO RELATED APPLICATION

This application claims the benefit under 35 U.S.C. §119 of Provisional Application Ser. No. 61/040,656, filed Mar. 29, 2008, said provisional application is incorporated herein by reference.

BACKGROUND INFORMATION

1. Technical Field

The present disclosure relates to the discrete timing and power gain control of multiple different parts of a transmitter chain.

2. Background Information

Wireless communication protocols and standards often involve the sending of information in a sequence of discrete bit times or symbols. As data rates have increased over the years, the duration of such bit times or symbols has become shorter. In some communication protocols today, a symbol includes a data communication time portion, as well as a first guard time that precedes the data communication time portion and a second guard time that follows the data communication time portion. Multiple such symbols are transmitted rapidly in back-to-back fashion such that the ending guard time of a symbol overlaps the beginning guard time of the next symbol. This overlap time may be referred to as the inter-symbol time. It may be desired or specified that the inter-symbol time be of a very short duration in order to increase data throughput rates of the transmitter-to-receiver link or to be compatible with communication standards and/or communication equipment. Making the inter-symbol times shorter and shorter in this way may, however, introduce problems including transmit power problems. In some conditions, difficulties in controlling the amount of transmit power delivered to a transmit antenna may be experienced.

SUMMARY

In a wireless communications system and method, transmitter power gain of a transmit chain is changed during an inter-symbol time between one symbol and the next symbol. A power gain change of a first part of the transmit chain is initiated a first time, whereas a power gain change of a second part of the transmit chain is initiated at a second time, such that the resulting power gain changes of the first and second parts both occur substantially within the inter-symbol time in a desired relationship to one another. In one example, the power gain change of the first part (for example, the non-power amplifier part of the transmit chain that is at least in part disposed within a transceiver integrated circuit) is initiated before the beginning of the inter-symbol time to account for expected serial bus latency between initiation and execution of the power gain change of the first part. The power gain change may, for example, be initiated by a processor sending a communication from a baseband integrated circuit across the serial bus to the transceiver integrated circuit.

The power gain change of the second part (for example, the power amplifier part of the transmit chain disposed in a power amplifier integrated circuit) is initiated during the inter-symbol time such that overall transmitted power does not exceed a predetermined amount of transmit power (for example, a maximum transmit power allowed under a communication standard). The power gain change of the second part may, for example, be initiated by the processor of the baseband integrated circuit writing a value to a register which in turn causes a digital signal to be output from terminals of the baseband integrated circuit such that the signal is communicated across dedicated signal conductors to the power amplifier integrated circuit. In one example, the time at which the power gain change of the first part is initiated is separated from the time at which the power gain of the second part is initiated by a substantial amount of time that is at least one quarter of the inter-symbol time. The initiation of the power gain changes of the first and second parts are timed with respect to each other such that the resulting power gain changes of the first and second part occur with a desired timing with respect to each other, and so that the overall power gain of the transmit chain changes in relatively smooth and orderly fashion.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
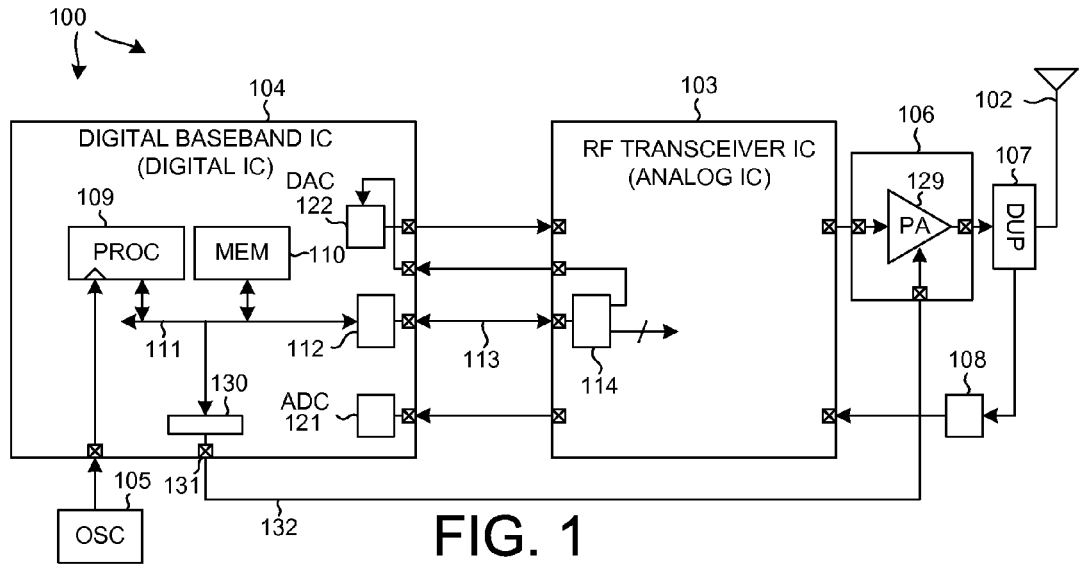
FIG. 1 is a very simplified high level block diagram of one particular type of mobile communication device 100 in accordance with one novel aspect.

FIG. 1 is a very simplified high level block diagram of one particular type of mobile communication device 100 in accordance with one novel aspect. The cellular telephone includes (among several other parts not illustrated) an antenna 102, two integrated circuits 103 and 104, an external oscillator 105, an external power amplifier integrated circuit 106, a duplexer 107 and a matching network 108. Integrated circuit 104 is called a "digital baseband integrated circuit" or a "baseband processor integrated circuit". Digital baseband integrated circuit 104 includes, among other parts not illustrated, a digital processor 109 that executes instructions stored in a processor-readable medium 110. Processor 109 can cause information to be communicated across parallel local bus 111 and serial bus interface 112 and serial bus conductors 113 to serial bus interface 114 of integrated circuit 103. Processor 109 is clocked by a clock signal received from external oscillator 105. Integrated circuit 103 is an RF transceiver integrated circuit. RF transceiver integrated circuit 103 is called a "transceiver" because it includes a transmitter as well as a receiver.

Figure 2:
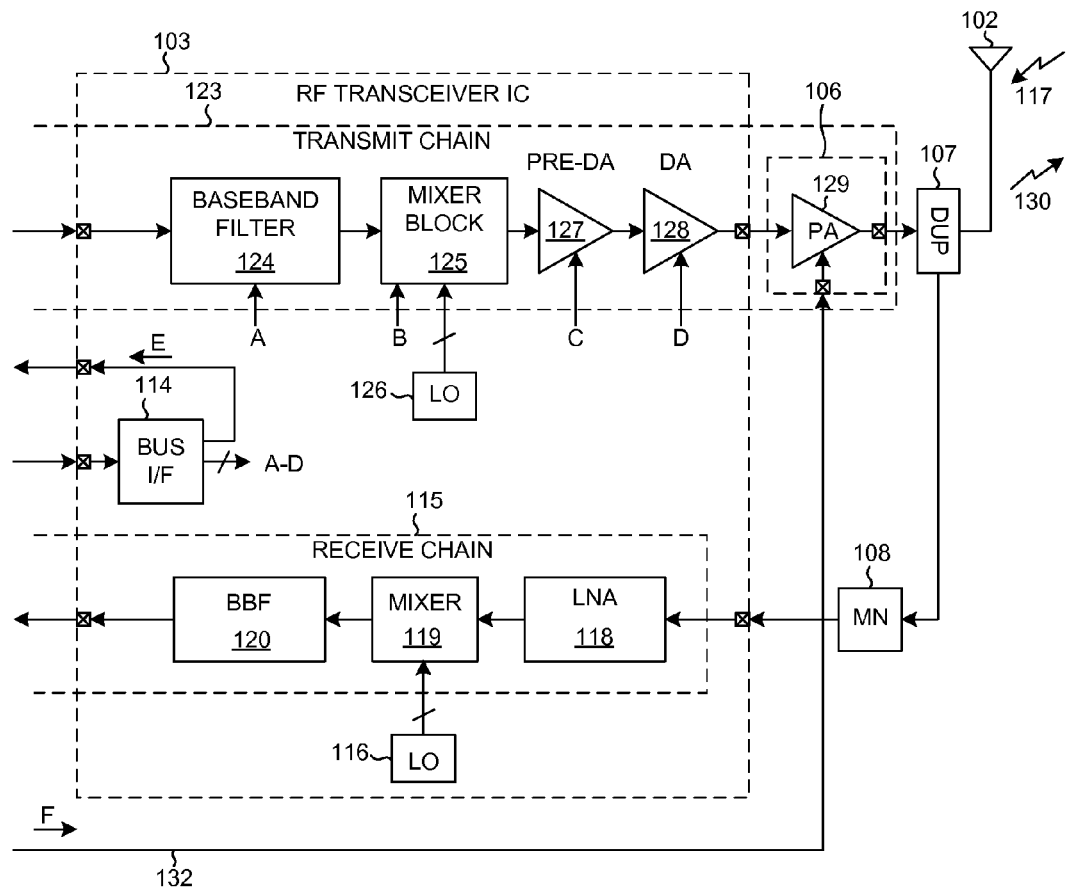
FIG. 2 is a more detailed block diagram of the RF transceiver integrated circuit 103 of FIG. 1.

FIG. 2 is a more detailed block diagram of the RF transceiver integrated circuit 103 of FIG. 1. The receiver includes a part of what is called a "receive chain" 115 as well as a local oscillator 116. When the cellular telephone is receiving, a high frequency RF signal 117 is received on antenna 102. Information from signal 117 passes through duplexer 107, through matching network 108, and into receive chain 115. Signal 117 is amplified by low noise amplifier (LNA) 118 and is down-converted in frequency by mixer 119. The resulting down-converted signal is filtered by baseband filter 120 and is passed to the digital baseband integrated circuit 104. An analog-to-digital converter 121 in the digital baseband integrated circuit 104 converts the signal into digital form and the resulting digital information is processed by digital circuitry in the digital baseband integrated circuit 104.

If the cellular telephone is transmitting, then information to be transmitted is converted into analog form by a digital-to-analog converter (DAC) 122 in the digital baseband integrated circuit 104 and passes through the remainder of a "transmit chain" 123 to duplexer 107 and antenna 102. Baseband filter 124 filters out noise due to the digital-to-analog conversion process. Mixer block 125 under control of local oscillator 126 then up-converts the signal into a high frequency signal. A pre-driver amplifier 127 and a driver amplifier 128 and an external power amplifier 129 amplify the high frequency signal to drive antenna 102 so that a high frequency RF signal 130 is transmitted from antenna 102. The digital baseband integrated circuit 104 tunes the transmitter by controlling the frequency of local oscillator 126 signal that is supplied by local oscillator 126 to mixer 125.

The overall power gain in the transmit path through the transmit chain to antenna 102 is a function of the gains of multiple different stages. These stages include the DAC 122, the baseband filter 124, the mixer block 125, the pre-driver amplifier 127, the driver amplifier 128, and the power amplifier 29. The processor 109 within integrated circuit 104 controls the power gain of the transmit chain, and therefore the overall transmit power at the antenna 102, by control signals or values A-F that control the gains of the various stages. The processor 109 can change the control signals or values A-E by communicating appropriate power control values across serial bus 113. The processor 109 can change the control signal F by writing a value to a register 130. The value (for example, a two-bit digital value) is supplied from register 130 as a digital signal (or signals) via terminal (or terminals) 131 and conductor (or conductors) 132 directly to power amplifier integrated circuit 106. The diagram of FIG. 2 is a simplified diagram. There may be additional stages and circuits that affect the overall transmit power gain that are also controlled by processor 109 in other specific examples.

Figure 3:
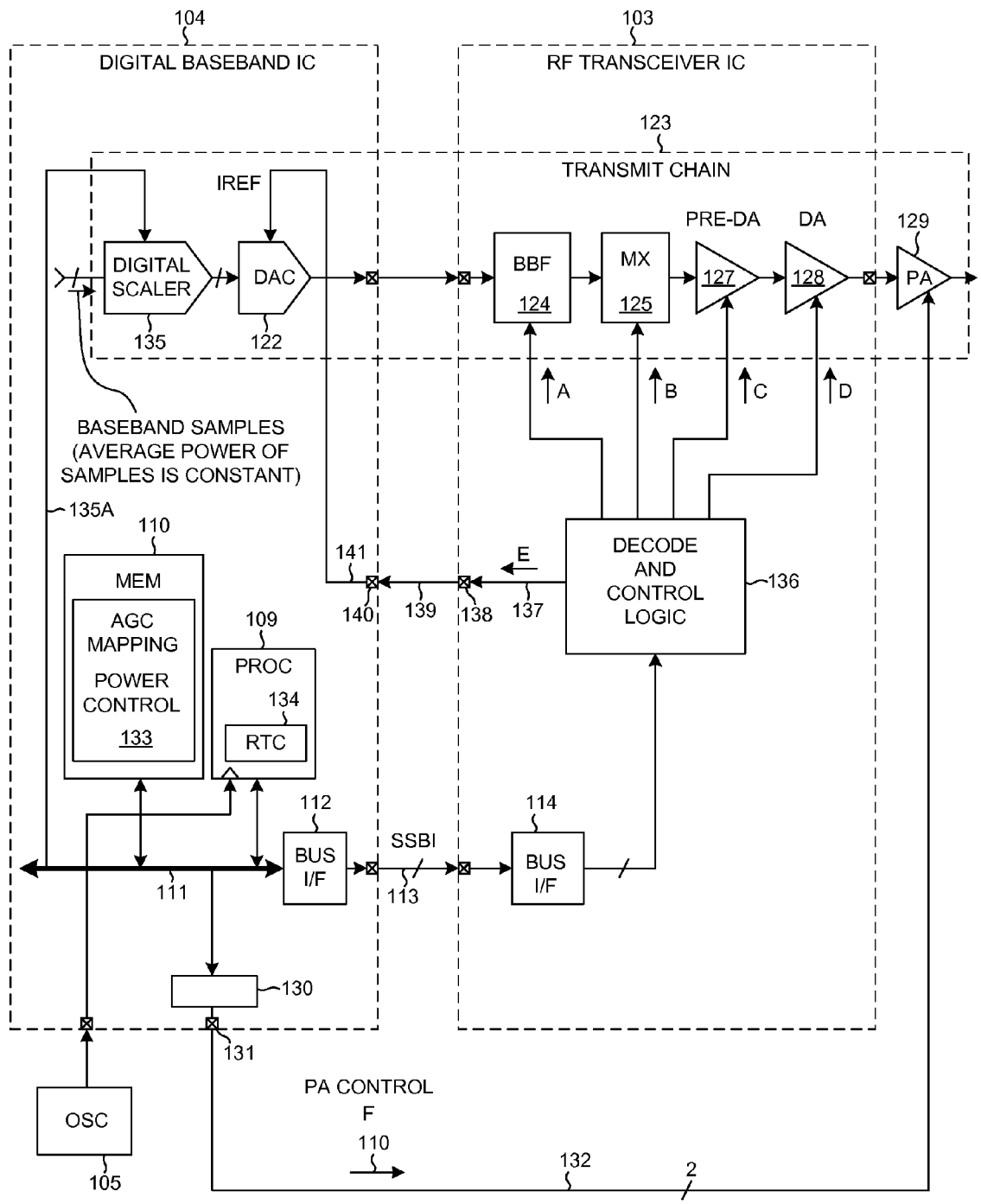
FIG. 3 is a more detailed block diagram of the transmit power control circuitry in baseband integrated circuit 104, in transceiver integrated circuit 103 and in power amplifier integrated circuit 106 of the system of FIG. 1.

FIG. 3 is a more detailed block diagram of the transmit power gain control circuitry in baseband integrated circuit 104, in transceiver integrated circuit 103 and in power amplifier integrated circuit 106. Processor 109 executes a set of processor-executable instructions 133 that controls the transmit power of the transmit chain and that also maintains a real time clock (RTC) value 134. The RTC value is illustrated in FIG. 3 as being within processor block 109 because the RTC value is maintained in a register within the processor. The real time clock value 134 increments as a function of the clock signal received from external oscillator 105. The overall power gain of the transmit chain can also be affected by the gain of another stage not illustrated in FIG. 2, a digital scaler circuit 135. Processor 109 can change the scaling value supplied by digital scaler 135 to DAC 122 by controlling a bit communicated over conductor 135A via local bus 111. The serial bus interface 114 of transceiver integrated circuit 103 is a fairly general purpose serial bus interface circuit. Specific power gain change control values that are communicated from integrated circuit 104 to bus interface 114 are, however, supplied to a decode and control logic circuit 136. Decode and control logic circuit 136 may, for example, receive a digital control value and convert it into an analog signal that in turn controls a designated stage. An example of an analog signal is a reference current. Signal E, for example, is a reference current that is supplied from decode and control logic 136, via conductor 137, terminal 138, conductor 139, terminal 140, and conductor 141 to DAC 122.

Figure 4:
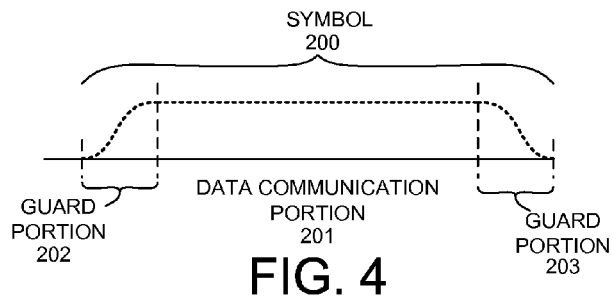
FIG. 4 is a diagram of an OFDM symbol.

FIGS. 4-7 illustrate a problem that can occur in the system of FIGS. 1-3. FIG. 4 is a diagram of an OFDM symbol 200. Symbol 200 includes a data communication portion 201 and two guard portions 202 and 203. In the diagram of FIG. 4, the horizontal axis is time which progresses from left to right. The vertical axis represents transmit power gain or transmit power.

Figure 5:
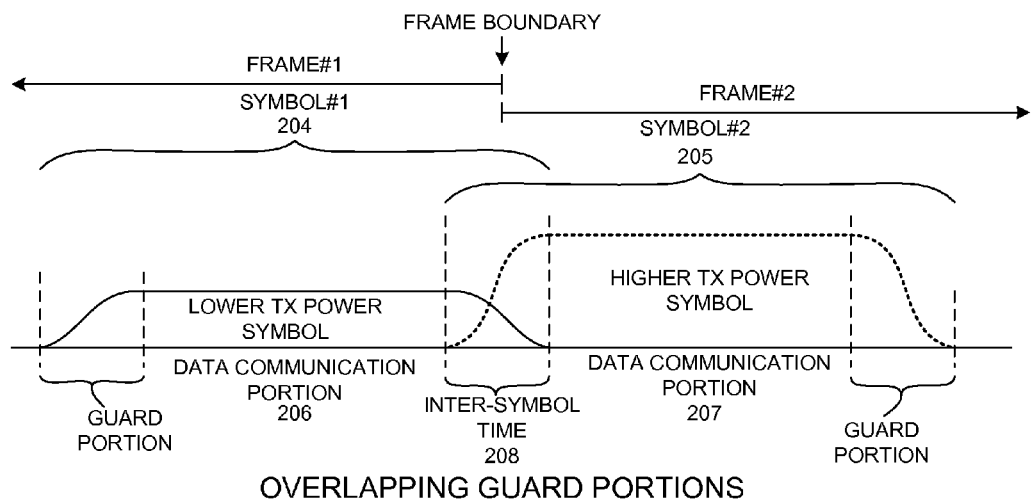
FIG. 5 is a diagram that shows two back-to-back transmitted OFDM symbols.

FIG. 5 is a diagram that shows two symbols SYMBOL#1 204 and SYMBOL#2 205 that are transmitted back-to-back. The ending guard portion of SYMBOL#1 204 is made to overlap the beginning guard portion of the SYMBOL#2 205. The period of time between the end of the data communication portion 206 of symbol 204 and the beginning of the data communication portion 207 of symbol 205 is referred to here as the "inter-symbol time" 208. There multiple symbols that are transmitted in back-to-back overlapping fashion within a frame. Generally, transmit power gain is not changed from symbol to symbol within a frame, but the transmit power gain can be made to change from one frame to another. In the illustration of FIG. 5, the first frame FRAME#1 is transmitted with a lower transmit power gain, whereas FRAME#2 is transmitted with a higher transmit power gain. The vertical axis in FIG. 5 represents total transmit power gain.

Figure 6:
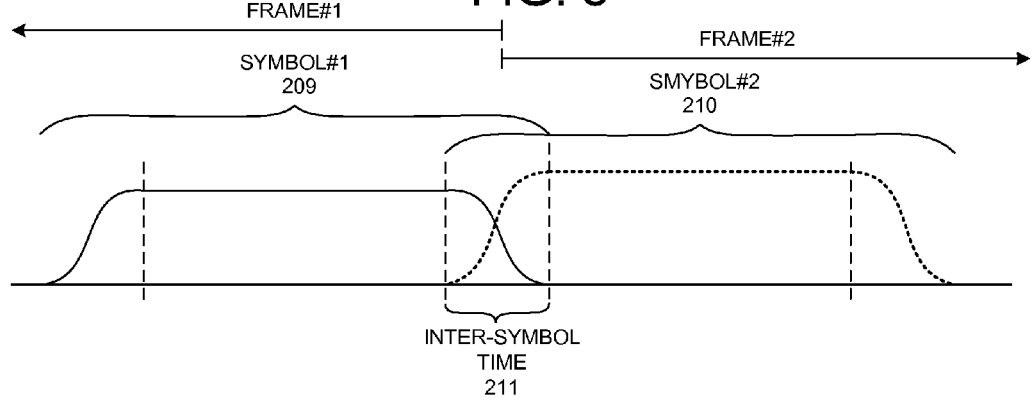
FIG. 6 is a diagram that illustrates two back-to-back overlapping OFDM symbols that are both transmitted with relatively high transmit chain power gains.

FIG. 6 is a diagram that illustrates two back-to-back overlapping symbols SYMBOL#1 209 and SYMBOL#2 210 that are both transmitted with relatively high transmit chain power gains. In the inter-symbol time 211, the transmit power gain settings of the various stages are changed from the settings for FRAME#1 to the settings for FRAME#2. The overall power gain of the non-power amplifier stages 135, 122, 124, 125, 127 and 128 is controllable to have many power gain steps (for example, eighty different gain steps). The gain differences between adjacent ones of these power gain steps is relatively small. The overall power gain of power amplifier 129, on the other hand, has only four power gain settings but the differences in the gain between the power gain steps of the power amplifier are relatively large. The power gain settings of the non-power amplifier portion of the transmit chain can therefore be thought of as being of fine granularity, whereas the power gain settings of the power amplifier portion of the transmit chain can be thought of as being of coarse granularity.

It may be desired to increase transmit power from frame to frame by incrementing the power gain with the fine granularity power gain steps. Power gain is not changed between symbols within a frame, but rather is changed during the inter-symbol times between frames. At a point in the incrementing, the power gain of the non-power amplifier portion of the transmit chain has reached its highest power gain setting. To increase power gain of the overall transmit chain further, the power gain setting of the non-power amplifier portion of the transmit chain is reduced from its previous value to an amount equal to the power gain step of the power amplifier minus the desired increase in power. The power gain setting of the power amplifier portion is increased one step to its next higher power gain setting. This is the situation illustrated in FIG. 6. The overall transmit power gain of SYMBOL#1 209 to the left is one fine granularity power gain step less than is the resulting overall transmit power gain of SYMBOL#2 to the right. In the SYMBOL#1 to the left, the power gain setting of the non-power amplifier portion of the transmit chain is at its highest value and the power gain setting of the power amplifier portion of the transmit chain is at second-to-highest power gain setting. In the SYMBOL#2 to the right, the power gain setting of the non-power amplifier portion of the transmit chain is at a lower value (lower than its value in SYMBOL#1) and the power gain setting of the power amplifier portion of the transmit chain is at its highest power gain setting.

Figure 7:
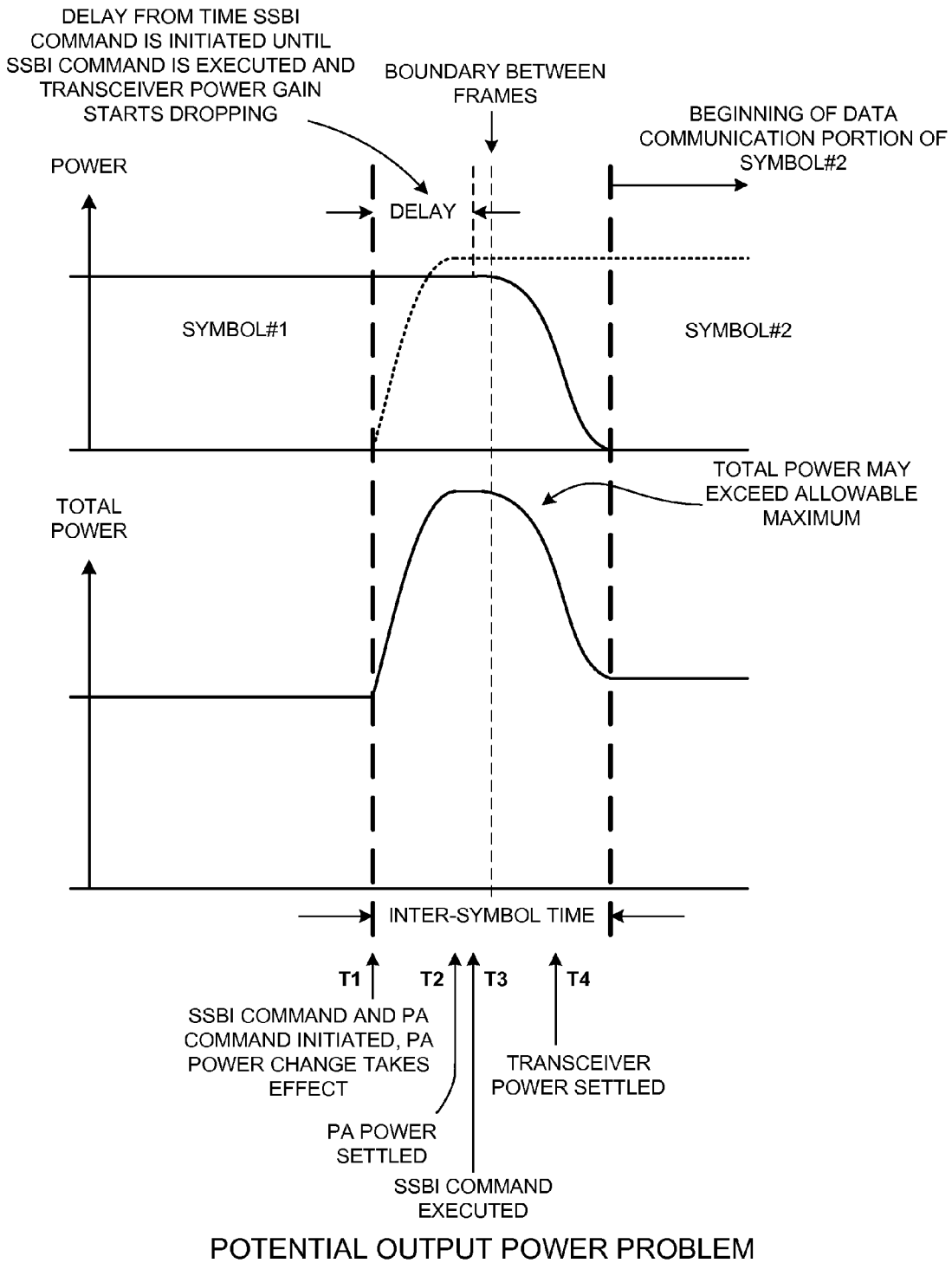
FIG. 7 is a diagram that illustrates a problem that can occur in one type of operation of the system of FIGS. 1-3.

FIG. 7 is a diagram that illustrates a problem that can occur in a situation of FIG. 6. The amount of time DELAY from a time T1 when processor 109 first initiates a change in the transceiver integrated circuit 103 stage gain settings until the power gain change starts to occur at time T3 is relatively large, whereas amount of time from when processor 109 first initiates a change in the power amplifier 106 stage gain setting at time T1 until the power gain change of the power amplifier is over at time T2 is very small. Time T4 is the time when the transceiver power gain change is over. Accordingly, if processor 109 were to try to initiate power gain changes of the transceiver integrated circuit 103 gain stages and power amplifier 106 at the same time, then the delay in the power gain change of the transceiver integrated circuit 103 from its highest power gain setting to a lower power gain setting may result in a brief time when the non-power amplifier portion of the transmit chain is still at its highest power gain setting when the gain setting of the power amplifier portion of the transmit chain has already been set to its highest power gain setting. Both the non-power amplifier portion of the transmit chain and the power amplifier portion of the transmit chain may therefore be at their highest power gain settings for a brief amount of time. The resulting high transmit power condition may exceed allowable transmit power specifications.

Figure 8:
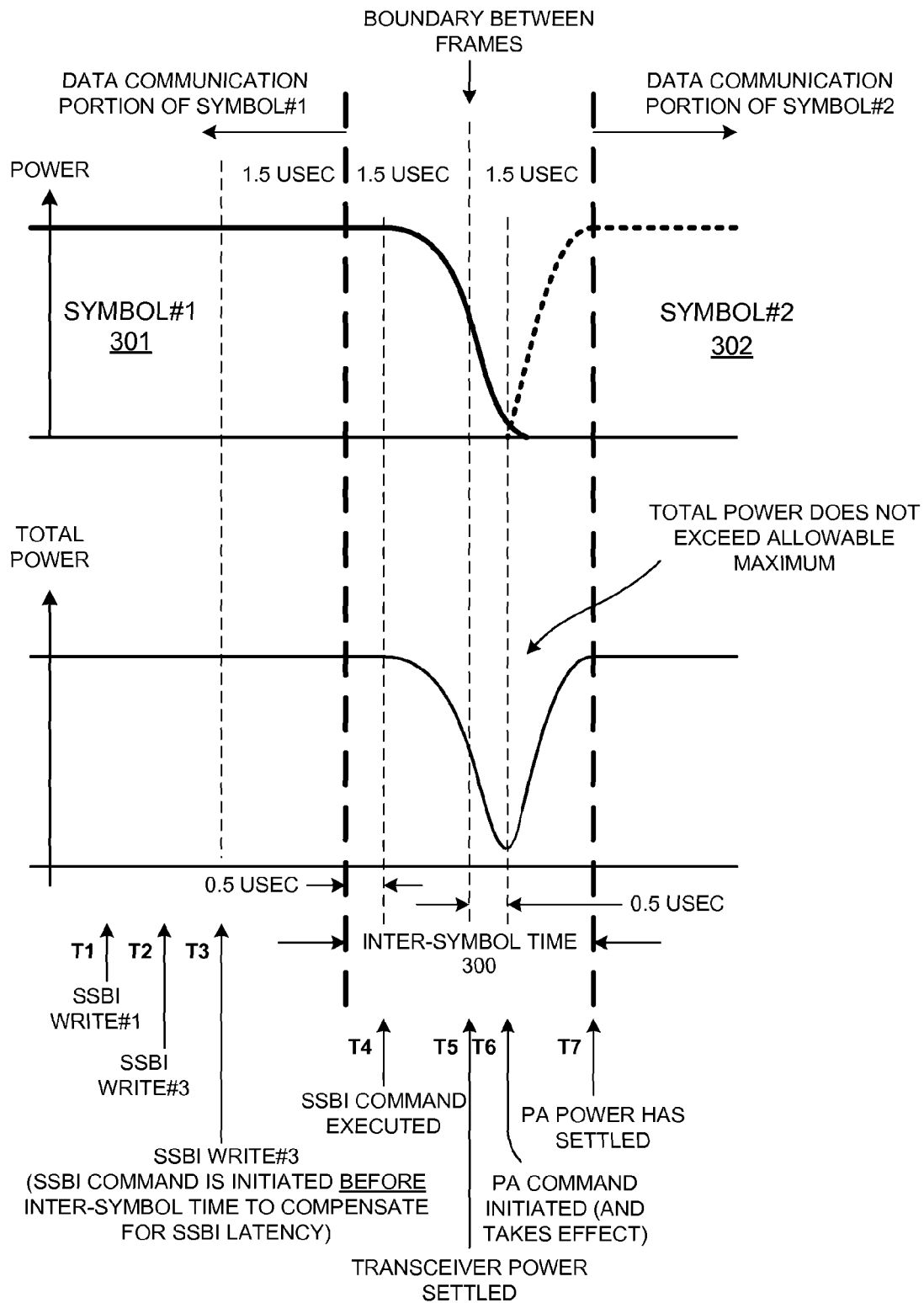
FIG. 8 is a diagram that illustrates a novel operation of the system of FIGS. 1-3.

FIG. 8 is a diagram that illustrates a novel operation of the system of FIGS. 1-3. The power gain change for the non-power amplifier stages that are changed across serial bus 113 are initiated at time T3 before the inter-symbol time 300 between the data communication portion of symbol 301 and the data communication portion of symbol 302. The transceiver integrated circuit power gain change actually involves three local bus writes by processor 109 into the transmit queue of the SSBI serial bus interface circuit 112. The first two writes at times T1 and T2 are made and the values are communicated across the serial bus 113 to serial bus interface block 114 in transceiver integrated circuit 103. The third write at time T3 is a high priority write that effectively passes other values in the transmit queue of serial bus interface 112 and is communicated across serial bus 113 to serial bus interface block 114 as fast as possible. The third write is a type of write that causes the receiving serial bus interface block 114 to associate the third write values with values of the first and second writes and to the "execute" these three write values together as soon as possible after they are received. The term "execute" here means that the values are supplied to the decode and control logic block 136 such that they can affect changes in the control values or signals A-E. The power gain change of non-power amplifier portion of the transmit chain is therefore initiated on the third write at time T3, and the associated power gain change is executed at time T4. An amount of time passes until at time T5 the power gain of the non-power amplifier portion of the transmit chain has settled to the value it should have for SYMBOL#2. Due to the latency required to communicate the power gain change command from processor 109 to serial bus interface block 114 and for the power gain change command to start to take effect, the power gain change is initiated back at time T3 before the beginning of the inter-symbol time 300.

In contrast to the latency associated with changing the power gain of the non-power amplifier portion of the transmit chain across serial bus 113, the latency for processor 109 to change the power gain of external power amplifier 129 is relatively short. Accordingly, processor 109 initiates the power gain change of power amplifier 129 at time T6 at or after the power gain of the transceiver has settled. The power gain change is effectively initiated as soon as processor 109 writes an appropriate value into register 130 because the delay through terminal 131 and across conductors 132 is minimal. In the present example, there are four power gain settings of power amplifier 129. Accordingly, there are two conductors 132 to communicate a two-bit power gain control value to power amplifier 129. In the illustration of FIG. 8 the power gain of power amplifier 129 has settled to its new value for SYMBOL#2 by the beginning of the data communication portion of SYMBOL#2 at time T7.

The relative times of times T1-T7 are set forth in the illustration of FIG. 8. Time T3 occurs 1.5 microseconds before the beginning of the inter-symbol time 300. Time T4 occurs approximately 0.5 microseconds after the beginning of the inter-symbol time. The frame boundary at time T5 is halfway through the inter-symbol time by definition. The time T6 is 0.5 microseconds after the frame boundary at time T5. Time T7 is the end of the inter-symbol time 300 at the beginning of the data communication portion of SYMBOL#2. Processor 106 uses real time clock 134 to control the times when the transceiver gain change is initiated at time T3 and the time when the power amplifier gain change is initiated at time T6.

Figure 9:
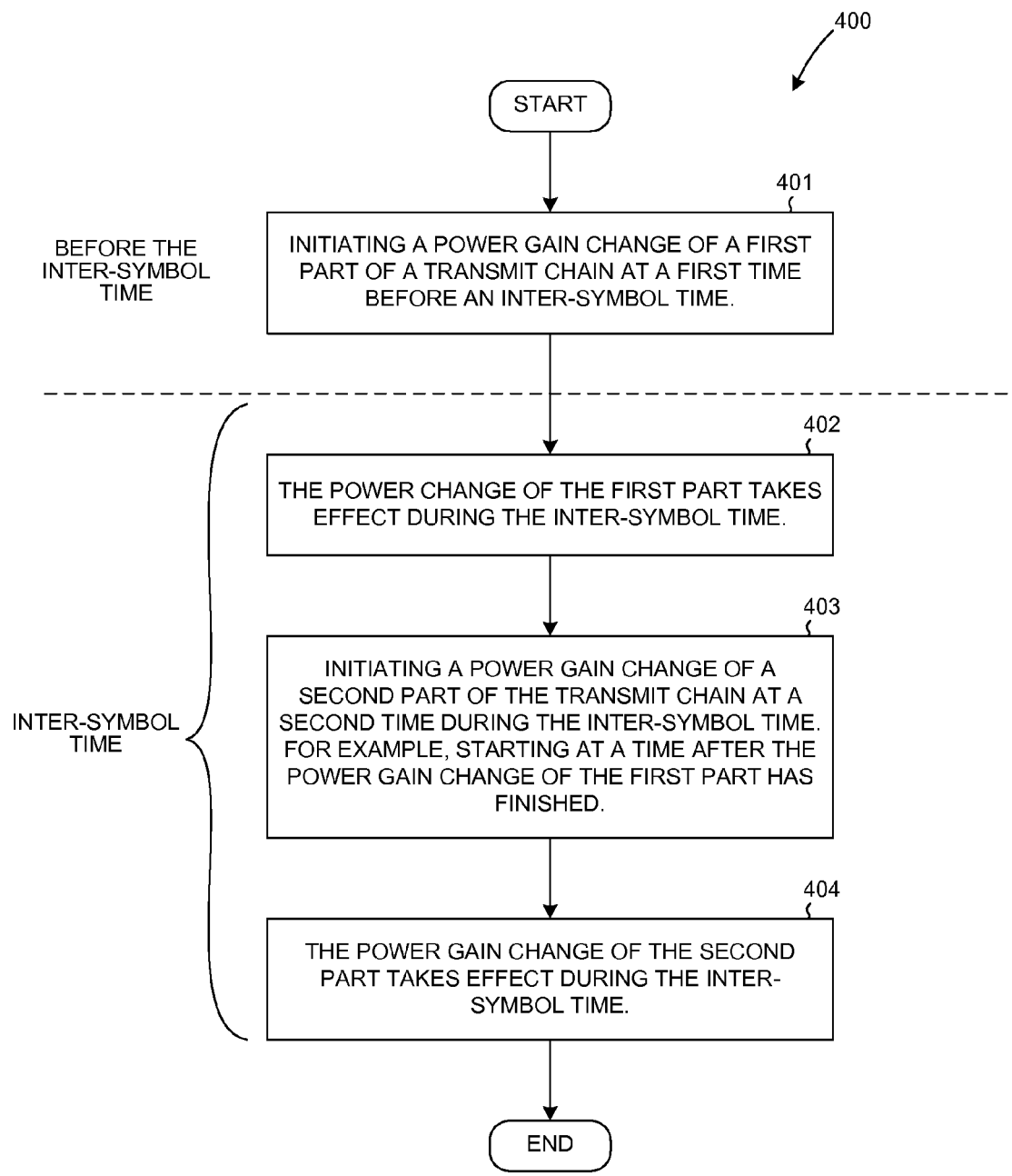
FIG. 9 is a flowchart of a method 400 in accordance with one novel aspect.

FIG. 9 is a flowchart of a method 400 in accordance with one novel aspect. In a first step (step 401) a power gain change of a first part of the transmit chain is initiated at a first time before an inter-symbol time. In one example, the first part of the transmit chain is a non-power amplifier portion (122, 124, 125, 127 and 128 disposed at least in part on a transceiver integrated circuit). The power gain change is initiated by sending a power gain change command across a serial bus to the transceiver integrated circuit. In one example, the first time is time T3 in the diagram of FIG. 8.

In a second step (step 402) the power gain change of the first part takes effect starting at a time during the inter-symbol time. In one example, the time when the power gain change of the first part takes effect is time T4 in the diagram of FIG. 8.

In a third step (step 403), a power gain change of a second part of the transmit chain is initiated at a second time during the inter-symbol time. In one example, the second time is time T6 in the diagram of FIG. 8 and the second part is a power amplifier of a power amplifier integrated circuit. The power gain change of the first part is concluded and the output power gain of the first part has settled before the power gain change of the second part is initiated at the second time.

In a third step (step 404), the power gain change of the second part takes effect during the inter-symbol time and the power gain of the second part has settled before the end of the inter-symbol time. In one example, the power gain change of the second part takes effect at time T6 and the power gain of the second part has settled before the end of the inter-symbol time at time T7 in the diagram of FIG. 8. In this example, digital scaler 135 can be considered a third part of the transmit chain. The mechanism for changing the gain of digital scaler 135 through bus 111 and conductor 135A is different from the serial bus mechanism by which the power gains of stages 122, 124, 125, 127 and 128 are changed. The three mechanisms (of the three parts of the transmit chain) have different execution latencies.

In one or more exemplary embodiments, the functions described may be implemented in hardware, software, firmware, or any combination thereof. If implemented in software, the functions may be stored on or transmitted over (as one or more instructions or code) a computer-readable or a processor-readable medium. Computer-readable or processor-readable media includes both computer storage media and communication media including any medium that facilitates transfer of a computer program from one place to another. A storage medium may be any available media that can be accessed by a computer. By way of example, and not limitation, such computer-readable or processor-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable or processor-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable or processor-readable media.

Although certain specific embodiments are described above for instructional purposes, the teachings of this patent document have general applicability and are not limited to the specific embodiments described above. The timing of initiation and/or execution of power gain changes for parts of a transmit chain can be extended to involve the control of the timing of initiation and/or execution of three or more different parts of a transmit chain. The timing of when a transceiver part of a transmit chain performs its power gain change need not be determined by when the third write of a linked set of serial bus transfers occurs, but rather may involve another mechanism that allows execution of a power gain change command for a part of the transceiver to be timed. A power gain change command sent from a first integrated circuit to a second integrated circuit may, for example, contain an indication of an absolute time or an amount of elapsed time that determines, as least in part, when the power change command is to be executed by the second integrated circuit. Accordingly, various modifications, adaptations, and combinations of the various features of the described specific embodiments can be practiced without departing from the scope of the claims that are set forth below.

What is claimed is:

1. A method comprising:
   (a) initiating, with a processor of a mobile communication device, a power gain change of a first integrated circuit of a transmit chain of the mobile communication device, across a serial bus, before an inter-symbol time between adjacent transmittal symbols such that the power gain change of the first integrated circuit occurs substantially during the inter-symbol time; and
   (b) initiating, with the processor, a power gain change of a second integrated circuit of the transmit chain across the serial bus during the inter-symbol time such that the power gain change of the second integrated circuit occurs substantially during the inter-symbol time
   wherein the initiating of the power gain change of (a) occurs during a data communication portion of a first symbol, wherein the inter-symbol time separates the data communication portion of the first symbol and a data communication portion of a second symbol, wherein the power gain change of the transmittal symbols is a power gain change from the first symbol to the second symbol, and wherein the initiating of the power gain change of (b) occurs during the inter-symbol time.

2. The method of claim 1, wherein a time at which the power gain change of the first integrated circuit is initiated and a time at which the power gain change of the second integrated circuit is initiated is separated from one another by at least one quarter of the inter-symbol time.

3. The method of claim 2, wherein the first integrated circuit of the transmit chain includes a driver amplifier, wherein the second integrated circuit of the transmit chain includes a power amplifier, and wherein the driver amplifier supplies a signal to the power amplifier.

4. The method of claim 2, wherein the initiating of the power gain change of (a) involves sending a power gain change command across the serial bus from an integrated circuit to the first integrated circuit, and wherein the initiating of the power gain change of (b) involves sending a signal from the integrated circuit to the second integrated circuit.

5. The method of claim 1, wherein the initiating of (a) and (b) is performed by the processor executing a set of processor-executable instructions.

6. The method of claim 1, wherein the processor performs the initiating of (a) by writing a value into a serial bus interface circuit, and wherein the processor performs the initiating of (b) without writing any value into the serial bus interface circuit.

7. The method of claim 1, wherein the transmit chain includes a digital-to-analog converter (DAC), a baseband filter, a mixer, a driver amplifier, and a power amplifier.

8. A method comprising:
   (a) sending a first communication, across a serial bus of a mobile communication device, from a first integrated circuit to a second integrated circuit such that a power gain of a first part of a transmit chain of a mobile communication device is changed, the first part of the transmit chain comprising the second integrated circuit, wherein the first communication is sent in (a) before an inter-symbol time between adjacent transmittal symbols such that the power gain change of (a) occurs substantially during the inter-symbol time; and
   (b) sending a second communication, across the serial bus, from the first integrated circuit to a third integrated circuit such that a power gain of a second part of the transmit chain is changed, the second part of the transmit chain comprising the third integrated circuit wherein the second communication is sent in (b) during the inter-symbol time such that the power gain change of (b) occurs substantially within the inter-symbol time, wherein changing of the power gain change of (a) occurs during a data communication portion of a first symbol, wherein the inter-symbol time separates the data communication portion of the first symbol and a data communication portion of a second symbol, wherein the power gain change of the transmittal symbols is a power gain change from the first symbol to the second symbol, and wherein changing of the power gain change of (b) occurs during the inter-symbol time.

9. The method of claim 8, wherein the inter-symbol time is a time between a data communication portion of a first OFDM symbol and a data communication of a second adjacent OFDM symbol.

10. The method of claim 8, wherein the third integrated circuit comprises a power amplifier.

11. The method of claim 8, wherein a processor executing a set of processor-executable instructions initiates the sending of (a) before the inter-symbol time, and wherein the processor initiates the sending of (b) during the inter-symbol time.

12. The method of claim 11, wherein the processor initiates the sending of (a) by writing a value into a serial bus interface circuit of the first integrated circuit, and wherein the processor initiates the sending of (b) without writing any value into the serial bus interface circuit of the first integrated circuit.

13. An apparatus, comprising:
a processor configured to (a) initiate a power gain change of a first portion of a transmit chain of a mobile communication device before an inter-symbol time between adjacent transmittal symbols such that the power gain change of the first portion occurs substantially within the inter-symbol time, and configured to (b) initiate a power gain change of a second portion of the transmit chain during the inter-symbol time such that the power gain change of the second portion occurs substantially within the inter-symbol time, wherein initiating of the power gain change of (a) occurs during a data communication portion of a first symbol, wherein the inter-symbol time separates the data communication portion of the first symbol and a data communication portion of a second symbol, wherein the power gain change of the transmittal symbols is a power gain change from the first symbol to the second symbol, and wherein the initiating of the power gain change of (b) occurs during the inter-symbol time.

14. The apparatus of claim 13, wherein the inter-symbol time is a time between a data communication portion of a first OFDM symbol and a data communication portion of a second OFDM symbol.

15. The apparatus of claim 13, wherein the first portion is a part of a first integrated circuit, and wherein the second portion is a part of a second integrated circuit.

16. The apparatus of claim 13, wherein the second portion is a power amplifier.

17. The apparatus of claim 13, further comprising:
a serial bus interface circuit, wherein the processor initiates the power gain change of the first portion by writing a value into the serial bus interface circuit.

18. The apparatus of claim 13, wherein the first portion is a part of a first integrated circuit, wherein the second portion is a part of a second integrated circuit, and wherein the power gain change of the first portion is substantially completed before the power gain change of the second portion has begun.

19. A computer program product, comprising:
a non-transitory computer-readable medium comprising code for:
initiating a first power gain change of a first part of a transmit chain of a mobile communication device before an inter-symbol time between adjacent transmittal symbols such that the first power gain change occurs substantially during the inter-symbol time; and
(a) initiating a second power gain change of a second part of the transmit chain during the inter-symbol time such that the second power gain change occurs substantially during the inter-symbol time, wherein the initiating of the power gain change of (a) occurs during a data communication portion of a first symbol, wherein the inter-symbol time separates the data communication portion of the first symbol and a data communication portion of a second symbol, wherein the power gain change of the transmittal symbols is a power gain change from the first symbol to the second symbol, and wherein the initiating of the power gain change of (b) occurs during the inter-symbol time.

20. The computer program product of claim 19, wherein the non-transitory computer-readable medium is a semiconductor memory of an integrated circuit, and wherein the integrated circuit includes a processor for executing the code.

21. An apparatus comprising:
a first interface for communicating with a first portion of a transmit chain of a mobile communication device;
a second interface for communicating with a second portion of the transmit chain; and
means for (a) initiating a power gain change of the first portion before an inter-symbol time between adjacent transmittal symbols such that the power gain change of the first portion occurs substantially during the inter-symbol time and for (b) initiating a power gain change of the second portion during the inter-symbol time such that the power gain change of the second portion occurs substantially during the inter-symbol time, wherein the initiating of the power gain change of (a) occurs during a data communication portion of a first symbol, wherein the inter-symbol time separates the data communication portion of the first symbol and a data communication portion of a second symbol, wherein the power gain change of the transmittal symbols is a power gain change from the first symbol to the second symbol, and wherein the initiating of the power gain change of (b) occurs during the inter-symbol time.

22. The apparatus of claim 21, wherein the first interface is a serial bus interface, wherein the first portion includes a mixer, and wherein the second portion is a power amplifier.

23. The apparatus of claim 1, wherein the inter-symbol time comprises a time between a respective data communication portion of each of the adjacent transmitted symbols.

24. The apparatus of claim 1, wherein the inter-symbol time corresponds to a time in which the adjacent transmitted symbols overlap.

25. The apparatus of claim 8, wherein the power gain change for the first part is initiated at a time before the inter-symbol time to account for latency of the serial bus.

26. The method of claim 1, wherein the power gain change of the first integrated circuit concludes before the power gain change of the second integrated circuit is initiated.

27. The method of claim 1,
wherein the first integrated circuit is configured to have a first plurality of power gain steps, each step corresponding to a power gain change; and
wherein the second integrated circuit is configured to have a second plurality of power gain steps, the second plurality of power gain steps being fewer than the first plurality of power gain steps.

28. The method of claim 27, wherein the power gain change between each step of the first plurality of power gain steps is less than the power gain change between each step of the second plurality of power gain steps.

29. The method of claim 1,
wherein the initiating of the power gain change of (a) occurs during a data communication portion of a first symbol;

wherein the inter-symbol time separates the data communication portion of the first symbol and a data communication portion of a second symbol;

wherein the power gain change of the first integrated circuit results in the first integrated circuit having a power gain for transmitting the second symbol; and wherein the power gain change of the second integrated circuit results in the second integrated circuit having a power gain for transmitting the second symbol.

* * * * *